PRODUCTION OF SEMICONDUCTOR FILMS

Filed Oct. 23, 1959

INVENTORS.
HENRY R. BARKEMEYER
WILLIAM J. McALEER
PETER I. POLLAK
BY J. Louis Wolk
Marion C. McCurdy
ATTORNEYS United States Patent Office 3,063,871

Patented Nov. 13, 1962

3,063,871
PRODUCTION OF SEMICONDUCTOR FILMS

Henry R. Barkemeyer, Plainfield, William J. McAleer, Roselle, and Peter I. Pollak, Scotch Plains, N.J., assignors to Merck & Co., Rahway, N.J., a corporation of New Jersey Filed Oct. 23, 1959, Ser. No. 848,380
6 Claims. (Cl. 117—201)

Figure 1:
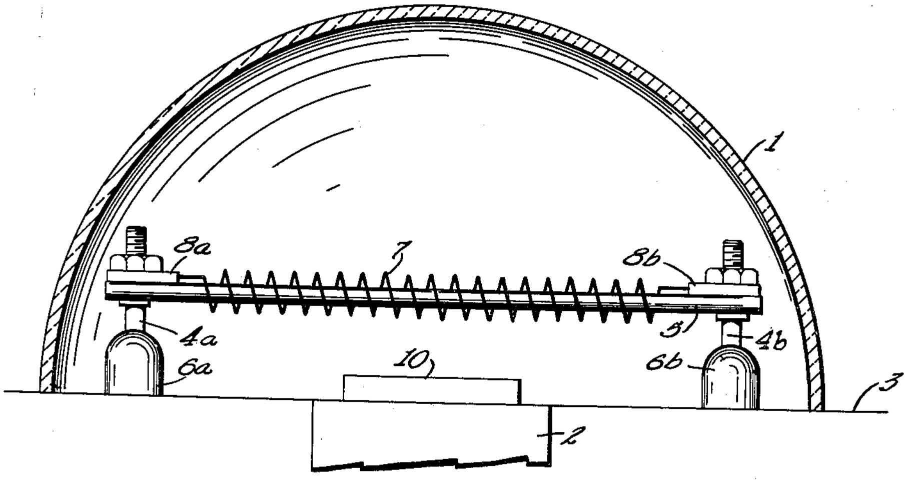

This invention relates to semiconductor films of silicon and germanium and more particularly to methods of producing such films.

It is an object of this invention to provide thin films of semiconductor materials deposited on a substrate which may be useful in the production of solar energy converters and printed circuitry active components.

Regarded in certain of its broader aspects, the process for the production of these novel semiconductor films comprises heating a semiconductor material such as silicon or germanium in vacuo until the semiconductor material evaporates and is deposited in the form of a film on the substrate.

The substrates which are employed in this novel process may be quartz (or metals with M.P. above 500° C.). The surface of the substrate should be free of imperfections such as scratches and clean as regards dirt and grease. In addition, substrates that have been previously plated with a metal such as gold, copper, silver or aluminum which are prepared by any of the methods well known in the art can be employed as a substrate in this invention.

Where the emitting source of silicon or germanium is supported on a conductive wire, the silicon or germanium is of a high degree of purity. The silicon or germanium is coated on the conductive wire by decomposition of silicochloroform and hydrogen at 1100° C. to 1250° C. in a furnace in which the wire is held.

Where the emitting source of silicon or germanium is in the form of a disc, the surface is cleaned by etching it in nitric acid and hydrofluoric acid solution or an equivalent method. It is then quenched with high resistivity, deionized water while still submerged in the etching solution. Finally, it is rinsed with high resistivity deionized water and warm air dried.

The novel features which are believed to be characteristic of the invention, both as to its organization and method of operation, together with further objects and advantages thereof, will be better understood from the following description considered in connection with the accompanying drawings, in which a presently preferred embodiment of the apparatus utilized in carrying out the method of the present invention is illustrated by way of example. It is to be expressly understood, however, that the drawing is for the purpose of illustration and description only and is not intended as a definition of the limits of the invention.

Figure 2:
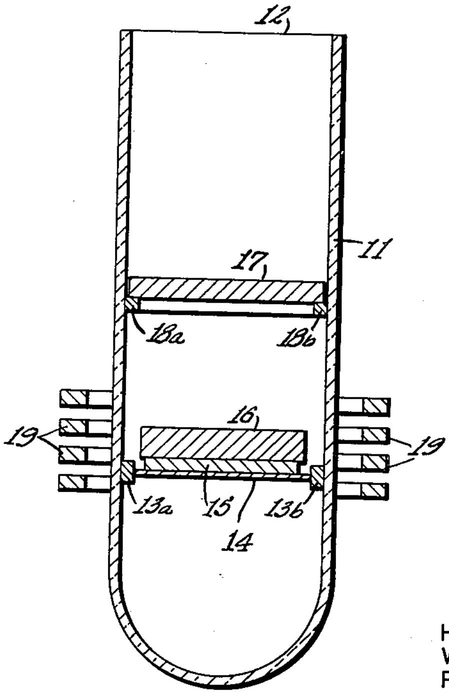

The process of the present invention will be more fully understood by reference to the accompanying drawings of which FIGS. 1 and 2 illustrate alternative apparatus that may be used to carry out the method of the present invention of applying a semiconductor material such as silicon or germanium to the substrate.

Reference is now made to FIG. 1 which shows a reactor 1 which is hermetically sealed so that the reactor vessel may be evacuated by the vacuum 2. Thus, the vessel may comprise a clear quartz bell 1 provided at its lower end with a closure plate 3 fitted thereto.

Within the reactor bell there are positioned two parallel vertical support rods 4A and 4B, joined at the upper ends by a horizontal support rod 5. The lower ends of the vertical support rods 4A and 4B are firmly seated in supports 6A and 6B which are hermetically sealed in the reactor base 3. An electrically conductive wire 7 made of molybdenum or tantalum and coated with silicon or germanium is loosely wound around the quartz support rod 5. The electrically conductive wire terminates at the vertical support rods 4A and 4B which support the electrical terminals 8A and 8B. The silicon or germanium on the conductive wire 7 is deposited on the substrate 10 which is mounted on the reactor base 3 and is tiltable so that the deposit of silicon or germanium on the surface of the quartz substrate can be regulated. The substrate 10 may consist of a plurality of pieces of quartz or vycor which are arranged in a rectangular figure approximately 10 mm. below the conductive wire 7, so that one row of the substrates is directly beneath the wire while the other are at oblique angles to the emitting wire.

In accordance with the operation of the apparatus illustrated in FIG. 1, the reactor is evacuated to $2\times10^{-4}$ mm. of mercury and the silicon heated to approximately 1200° C. by passing a current of 5.5 to 6 amps at 40 volts through the wire. The temperature of the substrates is approximately between 400° and 500° C. Time of deposition varied from 1 to 5 hours. The resultant films were slightly transparent and of brownish appearance in transmitted light with various other colors observable at times.

A conductive wire coated with germanium of high resistivity p-type material was substituted for the silicon and evaporation was carried out at an angle of about 20 degrees to the normal of the quartz, vycor or pyrex substrates, which are also kept at a temperature of about 400° C. during the evaporation. These films were of brownish appearance and of a slightly darker color than that of the silcon films. The vacuum was maintained around $1\times10^{-4}$ mm. of mercury during evaporation.

FIG. 2 shows an alternative apparatus wherein the silicon or germanium emitter is in the form of a disc. A clear quartz reactor tube 11 is hermetically sealed with a closure plate 12 fitted thereto.

Within the reactor tube there are positioned two supports 13A and 13B joined at either end by a quartz platform 14. A molybdenum disc 15 is mounted on the quartz platform 14. A single crystal silicon disc 16 is mounted on the molybdenum disc 15. A quartz plate 17 is mounted parallel to the single crystal silicon disc 16 and is supported by quartz ledges 18A and 18B on either side of the quartz plate.

The heating element 19 is positioned outside the reactor tube and is coupled to an inductive heater for radio-frequency heating of the single crystal silicon disc 16. The heating element should be mounted at a position which will afford maximum heating for the silicon crystal.

In accordance with the operation of the apparatus shown in FIG. 2, a molybdenum disc is inserted in the reactor upon the quartz platform; the silicon emitting source is then placed directly on top of it. The quartz substrate is set on its platform one-half inch above the silicon. The reactor is evacuated to $5\times10^{-6}$ mm., at which time the silicon is fired with a radio-frequency induction coil heater. After degassing the reaction chamber for ten minutes, the temperature is adjusted to in the range of 1100° C. to 1180° C., as measured by an optical pyrometer. The depositing vacuum is $2\times10^{-4}$ mm. of mercury and deposition is permitted to occur for periods of 10 to 45 minutes. A deposit of silicon varying in thickness from 1 to 3 microns results.

Various changes and modifications may be made in carrying out the present invention without departing from the spirit and scope thereof. Insofar as these changes and modifications are within the purview of the annexed claims, they are to be considered as part of this invention.

We claim:

1. The method of manufacturing a semiconductor film of a controlled thickness gradient comprising providing an emitter of semiconductor material within a suitable vacuum chamber, positioning within said chamber at least one substrate at an angle oblique to said emitter, passing an electric current through said emitter to heat said emitter to a temperature less than the melting point of said semiconductor material, and maintaining said chamber at a pressure less than $10^{-4}$ mm. Hg during said heating.

2. The method of manufacturing a silicon film of a controlled thickness gradient comprising providing within a suitable vacuum chamber an emitter comprising a conducting wire coated with silicon, positioning within said chamber at least one substrate at an angle oblique to said emitter, passing an electric current through said emitter to heat said emitter to a temperature between 1100° C. and 1300° C. thereby evaporating a portion of said silicon, and maintaining said chamber at a pressure between $10^{-4}$ and $10^{-6}$ mm. Hg during said evaporation.

3. The method according to claim 2 wherein the emitter is a molybdenum wire coated with silicon and heated to a temperature of approximately 1200° C. at a pressure of approximately $2\times10^{-4}$ mm. Hg.

4. The method according to claim 3 wherein the emitter is a tantalum wire coated with silicon.

5. The method of manufacturing a semiconductor film of a controlled thickness gradient comprising providing within a suitable vacuum chamber a conducting support, placing a semiconductor emitter source on said support, positioning a substrate within said chamber normal to said emitter source, firing said emitter with radio-frequency waves to heat said emitter to a temperature less than the melting point of said semiconductor, and maintaining the pressure within said chamber at less than $10^{-4}$ mm. Hg during said heating.

6. The method according to claim 5 wherein the emitter source is silicon heated to a temperature between 1100° C. and 1180° C. and the pressure within said chamber is maintained between $10^{-4}$ and $10^{-6}$ mm. Hg.

References Cited in the file of this patent

UNITED STATES PATENTS

| | | |
|---|---|---|
| 2,112,124 | Teves | Mar. 22, 1938 |
| 2,754,259 | Robinson et al. | July 10, 1956 |
| 2,802,759 | Moles | Aug. 13, 1957 |
| 2,832,702 | Schwartz | Apr. 29, 1958 |
| 2,855,328 | Long | Oct. 7, 1958 |

FOREIGN PATENTS

| | | |
|---|---|---|
| 307,775 | Switzerland | Aug. 16, 1955 |

OTHER REFERENCES

Holland: "Vacuum Deposition of Thin Films," (1956), John Wiley (N.Y.). (Pages 108, 109, 489–491 relied on.)